US012682834B2

(12) United States Patent
Lin et al.

(10) Patent No.: US 12,682,834 B2
(45) Date of Patent: Jul. 14, 2026

(54) DISPLAY PANEL

(71) Applicant: AUO Corporation, Hsinchu City (TW)

(72) Inventors: Syuan-Ying Lin, Hsinchu City (TW);
Cheng-Kuang Wang, Hsinchu City
(TW); Min-Hsuan Chiu, Hsinchu City
(TW); Wei-Ming Cheng, Hsinchu City
(TW); Ya-Jung Wang, Hsinchu City
(TW); Ting-Wei Guo, Hsinchu City
(TW); Shu-Hao Huang, Hsinchu City
(TW); Sung-Yu Su, Hsinchu City (TW)

(73) Assignee: AUO CORPORATION, Hsinchu City
(TW)

( * ) Notice: Subject to any disclaimer, the term of this
patent is extended or adjusted under 35
U.S.C. 154(b) by 0 days.

(21) Appl. No.: 18/931,411

(22) Filed: Oct. 30, 2024

(65) Prior Publication Data

US 2025/0191527 A1 Jun. 12, 2025

(30) Foreign Application Priority Data

Dec. 12, 2023 (TW) ................................. 112148358

(51) Int. Cl.
*G09G 3/32* (2016.01)
*H10D 86/40* (2025.01)
(Continued)

(52) U.S. Cl.
CPC ............. *G09G 3/32* (2013.01); *H10D 86/441*
(2025.01); *H10D 86/60* (2025.01);
(Continued)

(58) Field of Classification Search
CPC ............. G09G 3/32; G09G 2300/0452; G09G
2300/0465; G09G 2300/0819; G09G
2300/0852; G09G 2310/08; H10D
86/441; H10D 86/60; H10W 90/00; H01L
25/16; H01L 27/12
See application file for complete search history.

(56) References Cited

U.S. PATENT DOCUMENTS

2015/0356928 A1* 12/2015 Xie ....................... G09G 3/3225
345/694
2021/0125568 A1* 4/2021 Yuan .................... G09G 3/3266
(Continued)

FOREIGN PATENT DOCUMENTS

TW I857808 B 10/2024

*Primary Examiner* — Michael A Faragalla
(74) *Attorney, Agent, or Firm* — WPAT, PC

(57) ABSTRACT

A display panel includes a pixel circuit. The pixel circuit
includes a first sub-pixel circuit and a second sub-pixel
circuit. The first sub-pixel circuit includes a first light
emitting element and a first driving circuit. The first driving
circuit is coupled to the first light emitting element, and is
configured to conduct according to a first driving signal and
a second driving signal to drive the first light emitting
element. The second sub-pixel circuit includes a second light
emitting element, a third light emitting element and a second
driving circuit. The second driving circuit is coupled to the
second light emitting element and the third light emitting
element, is configured to conduct according to the first
driving signal to drive the second light emitting element, and
is configured to conduct according to the second driving
signal to drive the third light emitting element.

15 Claims, 4 Drawing Sheets

(51) Int. Cl.
    _H10D 86/60_        (2025.01)
    _H10W 90/00_        (2026.01)

(52) U.S. Cl.
    CPC ............... _G09G 2300/0452_ (2013.01); _G09G 2300/0465_ (2013.01); _G09G 2300/0819_ (2013.01); _G09G 2300/0852_ (2013.01); _G09G 2310/08_ (2013.01); _H10W 90/00_ (2026.01)

(56)                    References Cited

U.S. PATENT DOCUMENTS

2023/0290309 A1*    9/2023   Yu ........................ G09G 3/3233
2024/0036369 A1*    2/2024   Zhang ............... G02F 1/133391

* cited by examiner

DISPLAY PANEL

CROSS-REFERENCE TO RELATED APPLICATION

This application claims priority to Taiwan Application Serial Number 112148358, filed Dec. 12, 2023, which is herein incorporated by reference in its entirety.

BACKGROUND

Field of Invention

The present disclosure relates to a display device. More particularly, the present disclosure relates to a pixel circuit applied to transparent field sequential color (FSC) display panels.

Description of Related Art

Conventional method of driving micro-light emitting diodes is to use a plurality of signal lines (such as data lines) in a display device to simultaneously input gray-scale voltages to sub-pixel circuits corresponding to three primary colors of light to achieve a target display screen of mixed colors. However, a number of a plurality of signal lines of a display device and driving circuits that drive each micro-light emitting diode respectively occupy an area of a transparent display device, thereby affecting a transparency of a transparent display device.

For the foregoing reasons, there is a need for providing a display panel to solve the above problems encountered in related art approaches.

SUMMARY

One aspect of the present disclosure provides a display panel. The display panel includes a pixel circuit. The pixel circuit includes a first sub-pixel circuit and a second sub-pixel circuit. The first sub-pixel circuit includes a first light emitting element and a first driving circuit. The first driving circuit is coupled to the first light emitting element. The first driving circuit is conducted according to a first driving signal and a second driving signal at a first stage to drive the first light emitting element. The second sub-pixel circuit includes a second light emitting element, a third light emitting element and a second driving circuit. The second driving circuit is coupled to the second light emitting element and a third light emitting element. The second driving circuit is conducted according to the first driving signal at a second stage to drive the second light emitting element, and is conducted according to the second driving signal at a third stage to drive the third light emitting element.

Another aspect of the present disclosure provides a display panel. The display panel includes a pixel circuit. The pixel circuit includes a first sub-pixel circuit and a second sub-pixel circuit. The first sub-pixel circuit includes a first light emitting element. The first sub-pixel circuit is configured to drive the first light emitting element to emit a light with a first wavelength at a first stage. The second sub-pixel circuit includes a second light emitting element and a third light emitting element. The second sub-pixel circuit is configured to drive the second light emitting element to emit a light with a second wavelength at a second stage, wherein the second sub-pixel circuit is configured to drive the third light emitting element to emit a light with a third wavelength at a third stage. The first wavelength, the second wavelength and the third wavelength are different.

In view of the aforementioned shortcomings and deficiencies of the prior art, the present disclosure provides a display panel. Through a design of a pixel circuit of a display panel of the present disclosure, an area of a driving circuit of a pixel circuit is effectively reduced and an aperture ratio of a display panel is increased. In addition, a design of the present disclosure makes a number of each of data lines and signal lines close to the same to reduce panel defects (mura).

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
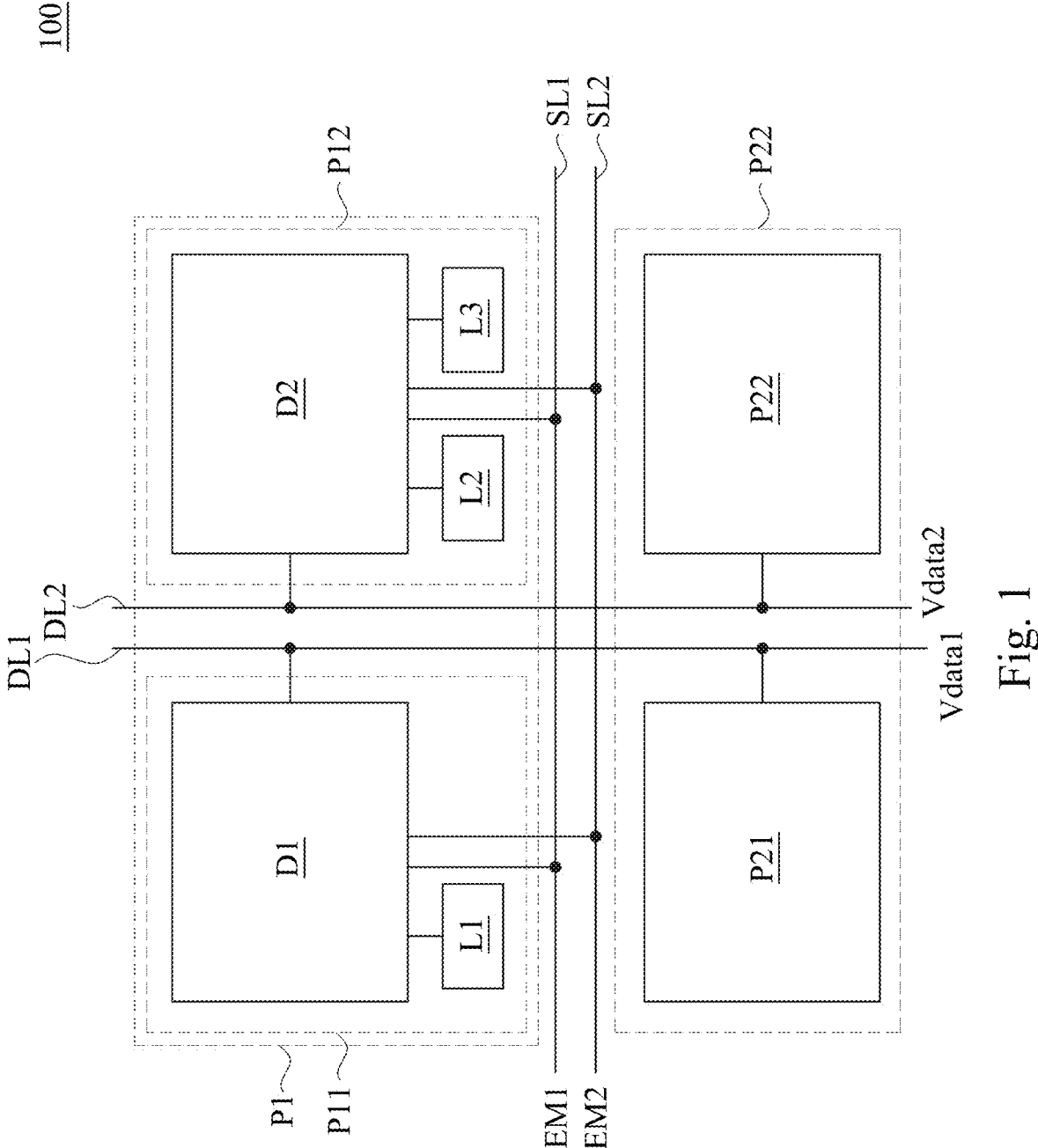
FIG. 1 depicts a schematic diagram of a display panel according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

is to use a plurality of signal lines (such as data lines) in a display device to simultaneously input gray-scale voltages to sub-pixel circuits corresponding to three primary colors of light to achieve a target display screen of mixed colors. However, a number of multiple signal lines of a display device occupies an area of a transparent display device. Then, a driving circuit that drives the micro-light-emitting diodes of different colors also occupies an area of a transparent display device. In addition, a number of vertical and horizontal traces in conventional display devices is inconsistent, causing signals transmitted by a larger number of traces to affect signals transmitted by a smaller number of traces, thereby causing defects (mura) situation in a display device. Following paragraphs of the present disclosure will describe how to improve the aforementioned problems.

FIG. 1 depicts a schematic diagram of the display panel 100 according to some embodiments of the present disclosure. In one embodiment, the display panel 100 includes a pixel circuit P1, a pixel circuit P2, a plurality of data lines (e.g. a data line DL1 and a data line DL2) and a plurality of signal lines (e.g. a signal line SL1 and a signal line SL2). The pixel circuit P1 includes a sub-pixel circuit P11 and a sub-pixel circuit P12. The pixel circuit P2 includes a sub-pixel circuit P21 and a sub-pixel circuit P22. The sub-pixel circuits P11-P12 are coupled to the signal line SL1 and the signal line SL2. The sub-pixel circuit P11 is coupled to the data line DL1. The sub-pixel circuit P12 is coupled to the data line DL2. It should be noted that the plurality of data lines (e.g. the data line DL1 and the data line DL2 in pairs) and the plurality of signal lines (e.g. a signal line SL1 and a signal line SL2 in pairs) of the display panel 100 are arranged at a fixed distance apart from each other. In other words, the plurality of data lines and the plurality of signal lines form a plurality of grids. Blank areas between the grids, the pixel circuit P1 and the pixel circuit P2 are opening areas. The pixel circuit P1 and the pixel circuit P2 are pixels in different rows.

Then, the sub-pixel circuit P11 includes a driving circuit D1 and a light emitting element L1. The driving circuit D1 is coupled to the light emitting element L1, the signal line SL1, the signal line SL2 and the data line DL1. The sub-pixel circuit P12 includes a driving circuit D2, a light emitting element L2 and a light emitting element L3. The driving circuit D2 is coupled to the light emitting element L2, the light emitting element L3, the signal line SL1, the signal line SL2 and the data line DL2.

In one embodiment, an optical wavelength of each of the light emitting element L1, the light emitting element L2 and the light emitting element L3 is different. For example, the light emitting element L1 can be a micro light-emitting diode (micro-LED) with a red light wavelength. The light emitting element L2 can be a micro light-emitting diode (micro-LED) with a green light wavelength. The light emitting element L3 can be a micro light-emitting diode (micro-LED) with a blue light wavelength. The light emitting element L1, the light emitting element L2 and the light emitting element L3 can be adjusted according to actual needs and are not limited to the embodiment of the present disclosure.

Internal structure of the sub-pixel circuit P21 is similar to internal structure of the sub-pixel circuit P11. Internal structure of the sub-pixel circuit P22 is similar to is similar to internal structure of the sub-pixel circuit P12. For the sake of brevity, and repetitious detailed descriptions are omitted here.

The sub-pixel circuit P11 and the sub-pixel circuit P12 are located in the same row. The sub-pixel circuit P11 and the sub-pixel circuit P21 are located in the same column. The sub-pixel circuit P12 and the sub-pixel circuit P22 are located in the same column. It should be noted that a position of each of the sub-pixel circuit P12 and the sub-pixel circuit P22 can be changed according to actual needs, and is not limited to the embodiment of the present disclosure.

Figure 2:
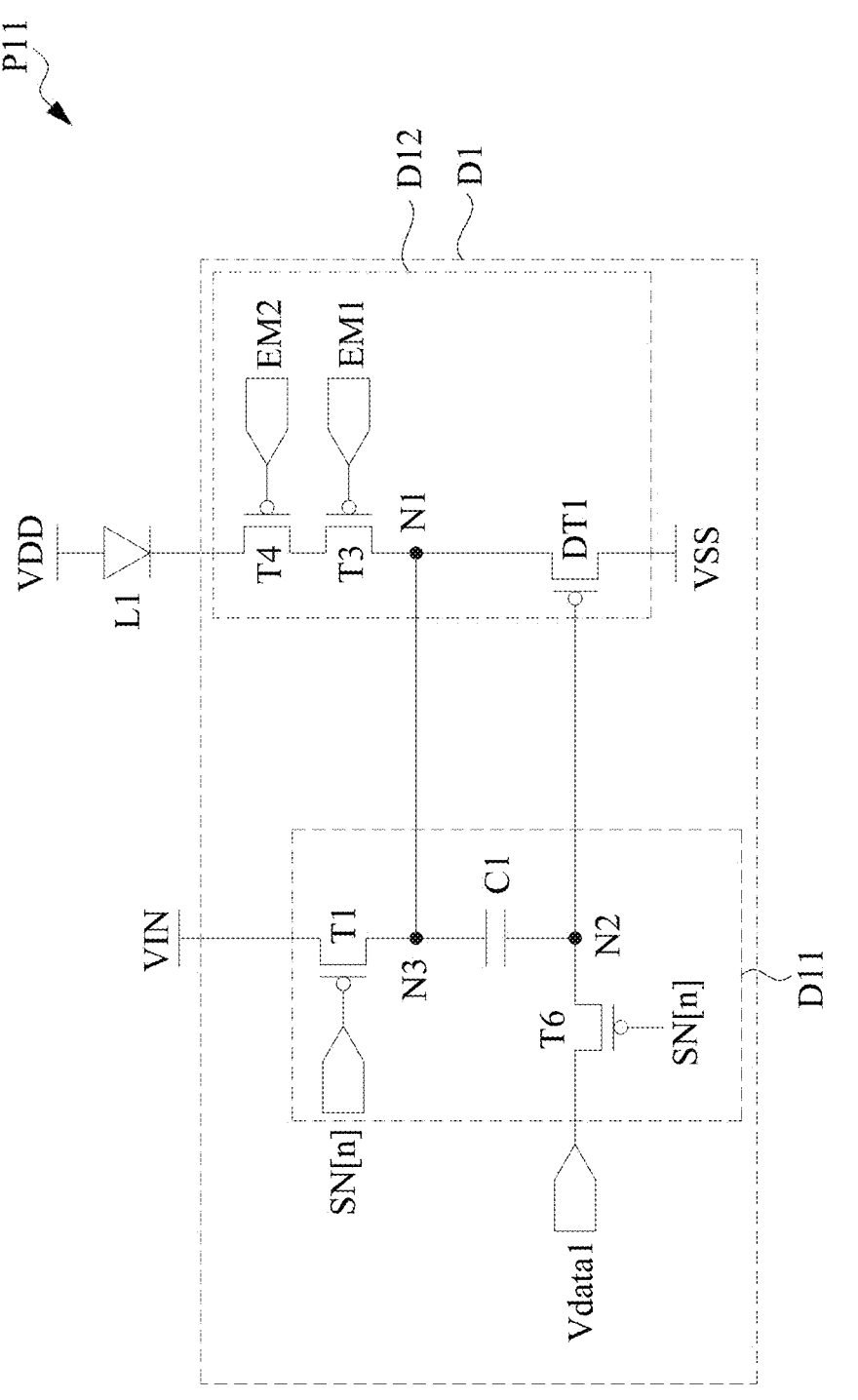
FIG. 2 depicts a schematic diagram of a sub-pixel circuit of a pixel circuit of a display panel according to some embodiments of the present disclosure.

FIG. 2 depicts a schematic diagram of the sub-pixel circuit P11 of the pixel circuit P1 of the display panel 100 in FIG. 1 according to some embodiments of the present disclosure. The sub-pixel circuit P11 includes a writing circuit D11, a control circuit D12 and the light emitting element L1. Please start from a top side and a right side of each of components in the picture as a first terminal, the light emitting element L1 includes a first terminal and a second terminal. The first terminal of the light emitting element L1 is coupled to a system high voltage source VDD.

The writing circuit D11 includes a transistor T1, a transistor T2 and a capacitor C1. The capacitor C1 includes a first terminal and a second terminal. The transistor T1 includes a first terminal, a second terminal and a control terminal. The first terminal of the transistor T1 is configured to receive an initial voltage of an initial voltage source VIN. The second terminal of the transistor T1 is coupled to the first terminal of the capacitor C1 and the node N3. The control terminal of the transistor T1 is configured to receive a writing control signal SN[n]. The transistor T1 is conducted in response to the writing control signal SN[n]. The transistor T2 includes a first terminal, a second terminal and a control terminal. The first terminal of the transistor T2 is coupled to the second terminal of the capacitor C1 and the node N2. The second terminal of the transistor T2 is coupled to the data line DL1. The control terminal of the transistor T2 is configured to receive a writing control signal SN[n]. The transistor T2 is conducted in response to the writing control signal SN[n].

The control circuit D12 includes a transistor T3, a transistor T4 and a driving transistor DT1. The driving transistor DT1 includes a first terminal, a second terminal and a control terminal. The first terminal of the driving transistor DT1 is coupled to the node N1. The second terminal of the driving transistor DT1 is coupled to the system low voltage source VSS. The control terminal of the driving transistor DT1 is coupled to the writing circuit D11. The transistor T3 includes a first terminal, a second terminal and a control terminal. The second terminal of the transistor T3 is coupled to the first terminal of the driving transistor DT1 and a node N1. The control terminal of the transistor T3 is configured to receive a driving signal EM1. The transistor T3 is conducted in response to the driving signal EM1. The transistor T4 includes a first terminal, a second terminal and a control terminal. The first terminal of the transistor T4 is coupled to the second terminal of the light emitting element L1. The second terminal of the transistor T4 is coupled to the first terminal of the transistor T3. The control terminal of the transistor T4 is configured to a driving signal EM2. The transistor T4 is conducted in response to the driving signal EM2.

Figure 3:
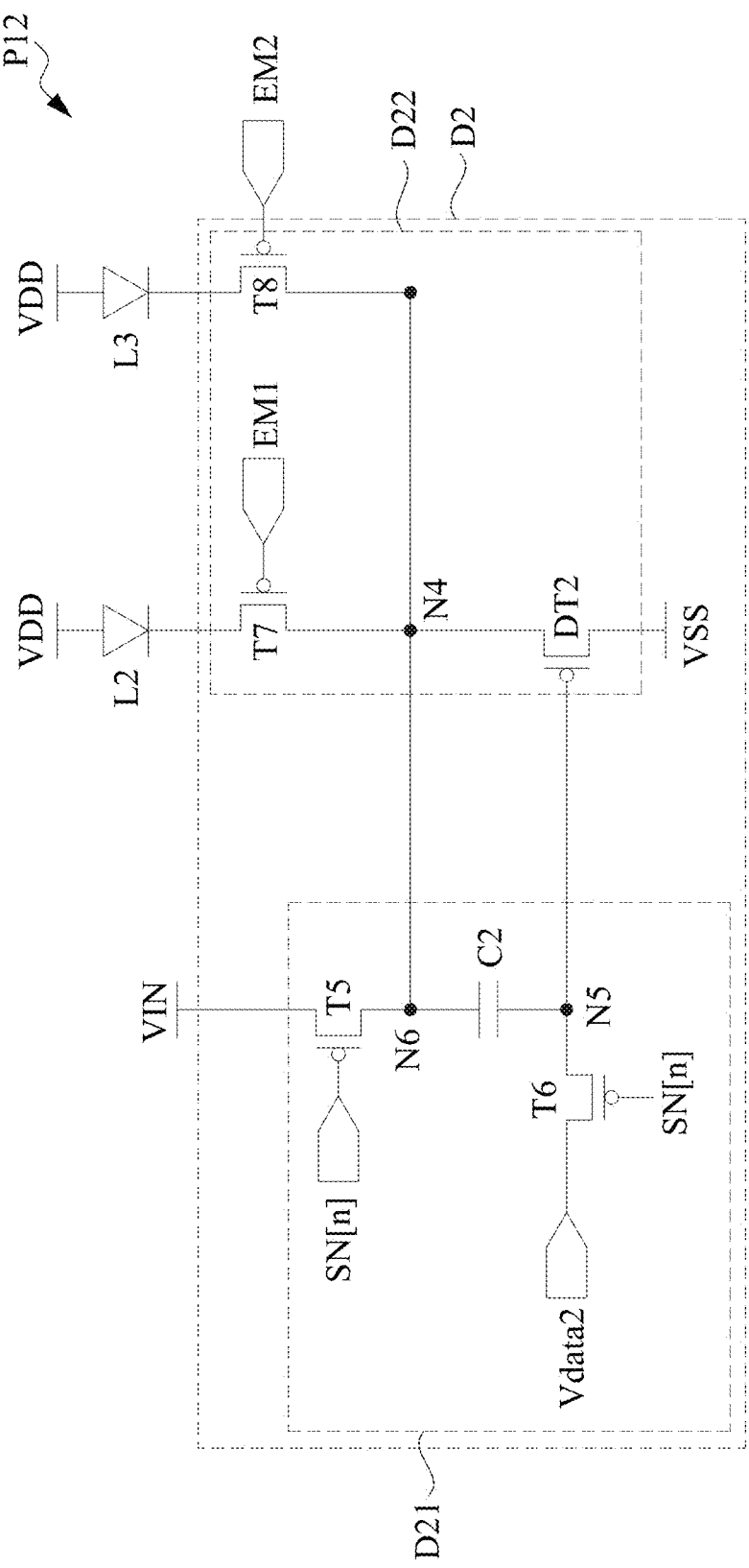
FIG. 3 depicts a schematic diagram of a sub-pixel circuit of a pixel circuit of a display panel according to some embodiments of the present disclosure.

FIG. 3 depicts a schematic diagram of the sub-pixel circuit P12 of the pixel circuit P1 of the display panel 100 in FIG. 1 according to some embodiments of the present disclosure. The sub-pixel circuit P12 includes a writing circuit D21, a control circuit D22, a light emitting element L2 and a light emitting element L3. Each of the light emitting element L2 and the light emitting element L3 includes a first terminal and a second terminal. The first terminal of each of the light emitting element L2 and the light emitting element L3 is coupled to the system high voltage source VDD.

The writing circuit D21 includes a transistor T5, a transistor T6 and a capacitor C2. The capacitor C2 includes first terminal and a second terminal. The transistor T5 includes a first terminal, a second terminal and a control terminal. The first terminal of the transistor T5 is configured to receive the initial voltage of the initial voltage source VIN. The second terminal of the transistor T5 is coupled to the first terminal of the capacitor C2 and a node N6. The control terminal of the transistor T5 is configured to receive the writing control signal SN[n]. The transistor T5 is conducted in response to the writing control signal SN[n]. The transistor T6 includes a first terminal, a second terminal and control terminal. The first terminal of the transistor T6 is coupled to the second terminal of the capacitor C2 and a node N5. The second terminal of the transistor T6 is coupled to the data line DL2. The control terminal of the transistor T6 s configured to receive the writing control signal SN[n]. The transistor T6 is conducted in response to the writing control signal SN[n].

The control circuit D22 includes a transistor T7, a transistor T8 and a driving transistor DT2. The driving transistor DT2 includes a first terminal, a second terminal and a control terminal. The first terminal of the driving transistor DT2 is coupled to the node N4. The second terminal of the driving transistor DT2 is coupled to the system low voltage source VSS. The transistor T7 includes a first terminal, a second terminal and a control terminal. The first terminal of the transistor T7 is coupled to the second terminal of the light emitting element L2. The second terminal of the transistor T7 is coupled to the node N4 and the first terminal of the driving transistor DT2. The control terminal of the transistor T7 is configured to receive the driving signal EM1. The transistor T7 is conducted in response to the driving signal EM1. The transistor T8 includes a first terminal, a second terminal and a control terminal. The first terminal of the transistor T8 is coupled to the second terminal of the light emitting element L3. The second terminal of the transistor T8 is coupled to the node N4 and the first terminal of the driving transistor DT2. The control terminal of the transistor T8 is configured to receive the driving signal EM2. The transistor T8 is conducted in response to the driving signal EM2.

Figure 4:
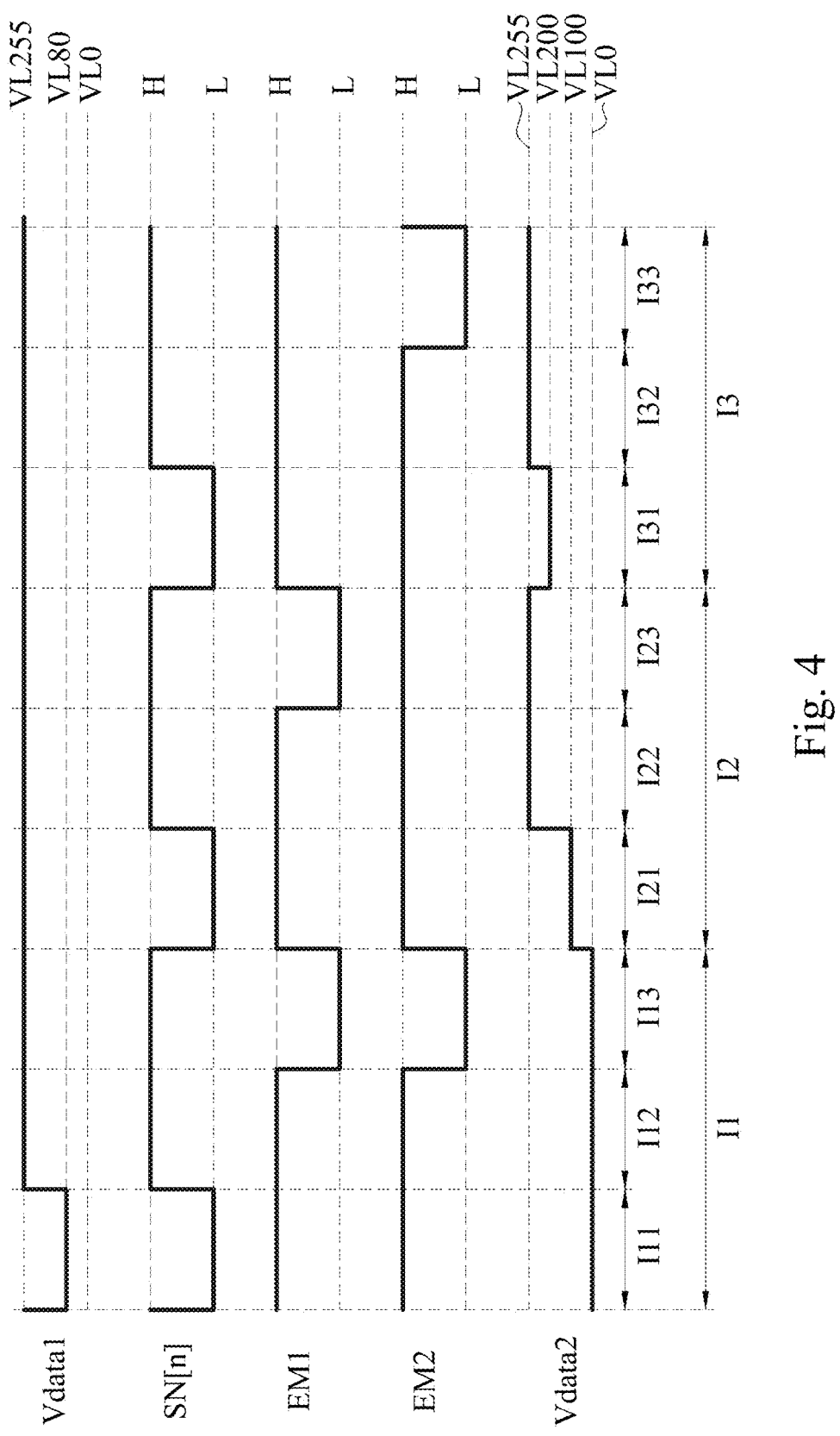
FIG. 4 depicts a signal timing diagram of a sub-pixel circuit of a pixel circuit of a display panel according to some embodiments of the present disclosure.

In some embodiments, in order to facilitate the understanding operations of the display panel 100 in FIG. 1, please refer FIG. 2 to FIG. 4 together, FIG. 4 depicts a signal timing diagram of the sub-pixel circuit P11 and the sub-pixel circuit P12 of the pixel circuit P1 of the display panel 100 in FIG. 1 according to some embodiments of the present disclosure.

In some embodiments, please refer to FIG. 2 and FIG. 4, at the sub-stage 111 of the stage I1, the writing control signal SN[n] is at a low level L. The driving signal EM1 and the driving signal EM2 are both at a high level H. The writing control signal SN[n] writes the initial voltage of the initial voltage source VIN to the node N3 through the transistor T1 of the writing circuit D11. The writing control signal SN[n] writes a data voltage Vdata1 of the data line DL1 to the node N3 through the transistor T2 of the writing circuit D11. The data voltage Vdata1 includes 256 gray-scale voltages. A gray-scale voltage VL0 is a voltage value of the zero-level gray scale. A gray-scale voltage VL255 is a voltage value of the 255-th-level gray scale. Subsequently, the driving transistor DT1 is configured to read the data voltage Vdata1 according to a driving voltage difference so as to generate a driving current to the light emitting element L1. The light emitting element L1 generates different gray-scale brightness according to a value of the data voltage Vdata1. For example, at the sub-stage I11, the data voltage Vdata1 inputted by the data line DL1 is the 80th-level gray-scale voltage VL80. At the sub-stage I13, the light emitting element L1 generates the brightness of the 80th-level gray level.

At the same time, please refer to FIG. 3 and FIG. 4, at the sub-stage I11 of the stage I1, the writing control signal SN[n] is at the low level L. The driving signal EM1 and the driving signal EM2 are both at the high level H. The writing control signal SN[n] writes the initial voltage of the initial voltage source VIN to the node N6 through the transistor T1 of the writing circuit D21. The writing control signal SN[n] writes the data voltage Vdata2 of the data line DL2 to the node N5 through the transistor T6 of the writing circuit D21. At this time, the data voltage Vdata2 is a zero-level gray-scale voltage VL0.

In some embodiments, please refer to FIG. 2 and FIG. 4, at the sub-stage 112 of the stage I1, the writing control signal SN[n], the driving signal EM1 and the driving signal EM2 are all at the high level H. Voltages of the node N2 and the node N3 of the sub-pixel circuit P11 maintain the voltage written at the sub-stage 111. At the same time, please refer to FIG. 3 and FIG. 4, at the sub-stage I12 of the stage I1, at the sub-stage I12 of the stage I1, the writing control signal SN[n], the driving signal EM1 and the driving signal EM2 are all at the high level H. Voltages of the node N5 and the node N6 of the sub-pixel circuit P12 maintain the voltage written at the sub-stage I11.

In some embodiments, please refer FIG. 2 and FIG. 4, at the sub-stage I13 of the stage I1, the writing control signal SN[n] is at the high level H. The driving signal EM1 and the driving signal EM2 are both at the low level L. The driving signal EM1 and the driving signal EM2 write the system high voltage of the system high voltage source VDD to the node N1 through the transistor T3 and the transistor T4 respectively so that the driving voltage difference is formed between the first terminal of the control terminal of the driving transistor DT1 to read the data voltage Vdata1 stored in the capacitor C1 of the writing circuit D11. The driving transistor DT1 outputs the driving current to the light emitting element L1 according to the driving voltage difference. The light emitting element L1 generates different gray-scale brightness according to a value of the data voltage Vdata1.

At the same time, please refer to FIG. 3 and FIG. 4, at the sub-stage I13 of the stage I1, the driving signal EM1 and the driving signal EM2 write the system high voltage of the system high voltage source VDD to the node N1 through the transistor T7 and the transistor T8 respectively so that the driving voltage difference is formed between the first terminal of the control terminal of the driving transistor DT1 to read the data voltage Vdata2 stored in the capacitor C2 of the writing circuit D21. The driving transistor DT1 outputs the driving current to the light emitting element L2 and the light emitting element L3 according to the driving voltage difference. Since the voltage written in the data voltage Vdata2 is the zero-level gray-scale voltage VL0, the light emitting element L2 and the light emitting element L3 do not emit light.

In some embodiments, please refer to FIG. 2, FIG. 3 and FIG. 4, operations of the sub-pixel circuit P11 and the sub-pixel circuit P12 at the sub-stage I21 of the stage I2 are similar to operations of the sub-pixel circuit P11 and the sub-pixel circuit P12 at the sub-stage I11 of the stage I1, and repetitious detailed descriptions are omitted here. For the sake of brevity, only the differences are described below. The writing control signal SN[n] writes the data voltage Vdata2 of the data line DL2 to the node N5 through the transistor T6 of the writing circuit D21. The data voltage Vdata2 includes 256 gray-scale voltages. For example, the data voltage Vdata2 inputted by the data line DL2 can be the 100-level gray-scale voltage VL100.

In addition, operations of the sub-pixel circuit P11 and the sub-pixel circuit P12 at the sub-stage I22 of the stage I2 are similar to operations of the sub-pixel circuit P11 and the sub-pixel circuit P12 at the sub-stage I12 of the stage I1, and repetitious detailed descriptions are omitted here.

In some embodiments, please refer to FIG. 2, FIG. 3 and FIG. 4, at the sub-stage I23 of the stage I2, the writing control signal SN[n] and the driving signal EM2 are at the high level H. The driving signal EM1 is at the low level L. The transistor T3 is conducted in response the driving signal EM1. The transistor T4 is turned off in response the driving signal EM2. The control circuit D12 cannot generate the driving current to the light emitting element L1. Therefore, the light emitting element L1 does not emit light. At the same time, please refer to FIG. 3 and FIG. 4, the transistor T7 is conducted in response to the driving signal EM1. The transistor T8 is turned off in response to the driving signal EM2. The control circuit D22 generates the driving current to the light emitting element L2, and cannot generate the driving current to the light emitting element L3. Therefore, at the sub-stage I23, the light emitting element L2 emits light, but the light emitting element L3 does not emit light.

In some embodiments, please refer to FIG. 2, FIG. 3 and FIG. 4, operations of the sub-pixel circuit P11 and the sub-pixel circuit P12 at the sub-stage I31 of the stage I3 are similar to operations of the sub-pixel circuit P11 and the sub-pixel circuit P12 at the sub-stage I11 of the stage I1, and repetitious detailed descriptions are omitted here. For the sake of brevity, only the differences are described below. The writing control signal SN[n] writes the data voltage Vdata2 of the data line DL2 to the node N5 through the transistor T6 of the writing circuit D21. The data voltage Vdata2 c includes 256 gray-scale voltages. It should be noted that the data voltage Vdata2 written at the sub-stage I21 and the data voltage Vdata2 written at the sub-stage I31 can be the same as or different from each other. For example, at the sub-stage I21, the data voltage Vdata2 inputted by the data line DL2 can be the 100-level gray-scale voltage VL100. At the sub-stage I31, the data voltage Vdata2 inputted by the data line DL2 can be the 200-level gray-scale voltage VL200. In other words, the sub-pixel circuit P12 of the present disclosure can input different gray-scale voltages at different stages so that the light emitting element L2 and the light emitting element L3 emit different brightness from each other respectively.

In addition, operations of the sub-pixel circuit P11 and the sub-pixel circuit P12 at the sub-stage I32 of the stage I3 are similar to operations of the sub-pixel circuit P11 and the sub-pixel circuit P12 at the sub-stage I12 of the stage I1, and repetitious detailed descriptions are omitted here.

In some embodiments, please refer to FIG. 2, FIG. 3 and FIG. 4, at the sub-stage I33 of the stage I3, the writing control signal SN[n] and the driving signal EM1 are both at the high level H. The driving signal EM2 is at low level L. The transistor T3 is turned off in response to the driving signal EM1. The transistor T4 is conducted in response to the driving signal EM2. The control circuit D12 cannot generate the driving current to the light emitting element L1. Therefore, the light emitting element L1 does not emit light. At the same time, please refer to FIG. 3 and FIG. 4, the transistor T7 is turned off in response to the driving signal EM1. The transistor T8 is conducted in response to the driving signal EM2. The control circuit D22 generates the driving current to the light emitting element L3, and cannot generate the driving current to the light emitting element L2. Therefore, at the sub-stage I33, the light emitting element L3 emits light, but the light emitting element L2 does not emit light.

Based on the aforementioned embodiments, the present disclosure provides a display panel. Through a shared driving circuit design of a sub-pixel circuit of a pixel circuit and of a display panel of the present disclosure, an area of a driving circuit of a pixel circuit is effectively reduced and an aperture ratio of a display panel is increased. In addition, a design of the present disclosure makes a number of each of data lines and signal lines close to the same to avoid vertical and horizontal signal lines transmitting different signals to each other, causing panel defects (mura).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A display panel, comprising:
a pixel circuit, comprising:
  a first sub-pixel circuit, comprising:
    a first light emitting element; and
    a first driving circuit, coupled to the first light emitting element, wherein the first driving circuit is conducted according to a first driving signal and a second driving signal at a first stage to drive the first light emitting element, wherein a level of the first driving signal is the same as a level of the second driving signal at the first stage; and
  a second sub-pixel circuit, comprising:
    a second light emitting element;
    a third light emitting element; and
    a second driving circuit, coupled to the second light emitting element and the third light emitting element, wherein the second driving circuit is conducted according to the first driving signal at a second stage to drive the second light emitting element, and is conducted according to the second driving signal at a third stage to drive the third light emitting element, wherein the level of the first driving signal is different from the level of the second driving signal at the second stage, wherein the level of the first driving signal is different from the level of the second driving signal at the third stage.

2. The display panel of claim 1, wherein an optical wavelength of each of the first light emitting element, the second light emitting element and the third light emitting element is different.

3. The display panel of claim 1, wherein the first driving circuit comprises:
a first writing circuit, configured to store a first data voltage from a first data line according to a writing control signal at a first sub-stage of the first stage; and
a first control circuit, coupled to the first writing circuit and the first light emitting element, wherein the first control circuit is conducted according to the first driving signal and the second driving signal at a second sub-stage of the first stage to read the first data voltage, so as to generate a first driving current to light the first light emitting element.

4. The display panel of claim 3, wherein the first writing circuit comprises:
a capacitor, configured to store the first data voltage, wherein the capacitor comprises a first terminal and a second terminal;
a first transistor, comprising:
  a first terminal, configured to receive an initial voltage of an initial voltage source;

a second terminal, coupled to the first terminal of the capacitor; and a control terminal, configured to receive the writing control signal, wherein the first transistor is conducted in response to the writing control signal; and a second transistor, comprising:

a first terminal, coupled to the second terminal of the capacitor;

a second terminal, coupled to the first data line; and a control terminal, configured to receive the writing control signal, wherein the second transistor is conducted in response to the writing control signal.

5. The display panel of claim 3, wherein the first control circuit comprises:

a driving transistor, comprising:

a first terminal;

a second terminal, coupled to a system low voltage source; and a control terminal, coupled to the first writing circuit;

a first transistor, comprising:

a first terminal;

a second terminal, coupled to the first terminal of the driving transistor; and a control terminal, configured to receive the first driving signal, wherein the first transistor is conducted in response to the first driving signal; and a second transistor, comprising:

a first terminal, coupled to the first light emitting element;

a second terminal, coupled to the first terminal of the first transistor; and a control terminal, configured to receive the second driving signal, wherein the second transistor is conducted in response to the second driving signal.

6. The display panel of claim 3, wherein the second driving circuit comprises:

a second writing circuit, configured to store a second data voltage from a second data line according to the writing control signal at a third sub-stage of the second stage, and configured to store a third data voltage from the second data line according to the writing control signal at a fifth sub-stage of the third stage; and a second control circuit, coupled to the second writing circuit, the second light emitting element and the third light emitting element, wherein the second control circuit is conducted according to the first driving signal at a fourth sub-stage of the second stage to read the second data voltage so as to generate a second driving current to light the second light emitting element, wherein the second control circuit is conducted according to the second driving signal at a sixth sub-stage of the third stage to read the third data voltage so as to generate a third driving current to light the third light emitting element.

7. The display panel of claim 6, wherein the second writing circuit comprises:

a capacitor, configured to store the second data voltage in the third sub-stage and store the third data voltage in the fifth sub-stage respectively, wherein the capacitor comprises a first terminal and a second terminal;

a first transistor, comprising:

a first terminal, configured to receive an initial voltage of an initial voltage source;

a second terminal, coupled to the first terminal of the capacitor; and a control terminal, configured to receive the writing control signal, wherein the first transistor is conducted in response to the writing control signal; and a second transistor, comprising:

a first terminal, coupled to the second terminal of the capacitor;

a second terminal, coupled to the second data line; and a control terminal, configured to receive the writing control signal, wherein the second transistor is conducted in response to the writing control signal.

8. The display panel of claim 6, wherein the second control circuit comprises:

a driving transistor, comprising:

a first terminal;

a second terminal, coupled to a system low voltage source; and a control terminal, coupled to the first writing circuit;

a first transistor, comprising:

a first terminal, coupled to the second light emitting element;

a second terminal, coupled to the first terminal of the driving transistor; and a control terminal, configured to receive the first driving signal, wherein the first transistor is conducted in response to the first driving signal; and a second transistor, comprising:

a first terminal, coupled to the third light emitting element;

a second terminal, coupled to the first terminal of the driving transistor; and a control terminal, configured to receive the second driving signal, wherein the second transistor is conducted in response to the second driving signal.

9. The display panel of claim 6, further comprising:

a first signal line, configured to transmit the first driving signal to the first sub-pixel circuit and the second sub-pixel circuit; and a second signal line, configured to transmit the second driving signal to the first sub-pixel circuit and the second sub-pixel circuit.

10. The display panel of claim 6, wherein the second data voltage and the third data voltage are both a zero-level gray-scale voltage in the first sub-stage of the first stage.

11. The display panel of claim 1, wherein an aperture ratio of the first sub-pixel circuit is different from an aperture ratio of the second sub-pixel circuit.

12. The display panel of claim 11, wherein the aperture ratio of the first sub-pixel circuit is larger than the aperture ratio of the second sub-pixel circuit.

13. The display panel of claim 1, wherein the display panel comprises a plurality of data lines and a plurality of signal lines, wherein the plurality of data lines are perpendicular to the plurality of signal lines.

14. The display panel of claim 13, wherein a number of the plurality of data lines is a same as a number of the plurality of signal lines.

15. A display panel, comprising:

a pixel circuit, comprising:

a first sub-pixel circuit, comprising:

a first light emitting element;

wherein the first sub-pixel circuit is configured to drive the first light emitting element to emit a light with a first wavelength according to a first driving signal and a second driving signal at a first stage, wherein a level of the first driving signal is the same as a level of the second driving signal at the first stage; and a second sub-pixel circuit, comprising:

a second light emitting element;

a third light emitting element;

wherein the second sub-pixel circuit is configured to drive the second light emitting element to emit a light with a second wavelength according to the first driving signal at a second stage, wherein the second sub-pixel circuit is configured to drive the third light emitting element to emit a light with a third wavelength according to the second driving signal at a third stage, wherein the first wavelength, the second wavelength and the third wavelength are different, wherein the level of the first driving signal is different from the level of the second driving signal at the second stage, wherein the level of the first driving signal is different from the level of the second driving signal at the third stage.

\* \* \* \* \*